(12) United States Patent
Koyanagi

(10) Patent No.: US 10,812,041 B2
(45) Date of Patent: Oct. 20, 2020

(54) ELASTIC WAVE DEVICE AND MANUFACTURING METHOD FOR SAME

(71) Applicant: Murata Manufacturing Co., Ltd., Nagaokakyo-shi, Kyoto-fu (JP)

(72) Inventor: Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 34 days.

(21) Appl. No.: 16/197,429

(22) Filed: Nov. 21, 2018

(65) Prior Publication Data

US 2019/0089334 A1 Mar. 21, 2019

Related U.S. Application Data

(63) Continuation of application No. PCT/JP2017/014760, filed on Apr. 11, 2017.

(30) Foreign Application Priority Data

Jun. 21, 2016 (JP) .................. 2016-122495

(51) Int. Cl.
*H03H 9/10* (2006.01)
*H03H 9/02* (2006.01)
(Continued)

(52) U.S. Cl.
CPC .......... *H03H 9/1092* (2013.01); *H01L 23/02* (2013.01); *H01L 41/053* (2013.01); *H03H 3/08* (2013.01);
(Continued)

(58) Field of Classification Search
CPC ............. H03H 9/6483; H03H 9/1092; H03H 9/02992; H03H 3/08; H03H 9/14588;
(Continued)

(56) References Cited

U.S. PATENT DOCUMENTS

2004/0196119 A1  10/2004 Shibahara et al.
2008/0204167 A1   8/2008 Takamine
(Continued)

FOREIGN PATENT DOCUMENTS

JP  2002-016466 A   1/2002
JP  2004-282707 A  10/2004
(Continued)

OTHER PUBLICATIONS

Official Communication issued in International Patent Application No. PCT/JP2017/014760, dated Jun. 6, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes an IDT electrode on a piezoelectric substrate to define a longitudinally coupled resonator elastic wave filter, a three-dimensional wiring portion on the piezoelectric substrate and connected to the longitudinally coupled resonator elastic wave filter, and a cover surrounding the longitudinally coupled resonator elastic wave filter on the piezoelectric substrate. The three-dimensional wiring portion includes a lower layer wiring line, an upper layer wiring line, and an insulating layer stacked between the lower layer wiring line and the upper layer wiring line. The cover includes a portion on the three-dimensional wiring portion.

17 Claims, 10 Drawing Sheets

(51) Int. Cl.
    *H01L 23/02*   (2006.01)
    *H03H 3/08*    (2006.01)
    *H03H 9/25*    (2006.01)
    *H01L 41/053*  (2006.01)
    *H03H 9/00*    (2006.01)
    *H03H 9/145*   (2006.01)
    *H03H 9/64*    (2006.01)

(52) U.S. Cl.
    CPC ...... *H03H 9/0085* (2013.01); *H03H 9/02574* (2013.01); *H03H 9/02992* (2013.01); *H03H 9/14588* (2013.01); *H03H 9/25* (2013.01); *H03H 9/6483* (2013.01)

(58) Field of Classification Search
    CPC .... H03H 9/02574; H03H 9/0085; H03H 9/25; H01L 23/02; H01L 41/053
    USPC .......................................... 333/133, 193–196
    See application file for complete search history.

(56) References Cited

U.S. PATENT DOCUMENTS

| | | | |
|---|---|---|---|
| 2012/0280768 A1* | 11/2012 | Nakayama | H03H 9/0057 333/193 |
| 2013/0187730 A1* | 7/2013 | Nishizawa | H03H 9/54 333/193 |
| 2014/0354373 A1* | 12/2014 | Ikeuchi | H03H 9/6456 333/133 |
| 2016/0036410 A1 | 2/2016 | Tsuda | |
| 2017/0155372 A1 | 6/2017 | Kikuchi et al. | |

FOREIGN PATENT DOCUMENTS

| | | |
|---|---|---|
| JP | 2009-117730 A | 5/2009 |
| JP | 2011-160024 A | 8/2011 |
| JP | 2015-156626 A | 8/2015 |
| WO | 2007/055077 A1 | 5/2007 |
| WO | 2014/171369 A1 | 10/2014 |
| WO | 2016/063738 A1 | 4/2016 |

\* cited by examiner

ELASTIC WAVE DEVICE AND MANUFACTURING METHOD FOR SAME

CROSS REFERENCE TO RELATED APPLICATIONS

This application claims the benefit of priority to Japanese Patent Application No. 2016-122495 filed on Jun. 21, 2016 and is a Continuation Application of PCT Application No. PCT/JP2017/014760 filed on Apr. 11, 2017. The entire contents of each application are hereby incorporated herein by reference.

BACKGROUND OF THE INVENTION

1. Field of the Invention

The present invention relates to an elastic wave device that includes a longitudinally coupled resonator elastic wave filter and a three-dimensional wiring portion, and to a method of manufacturing the elastic wave device.

2. Description of the Related Art

Heretofore, various elastic wave devices that include a longitudinally coupled resonator elastic wave filter have been proposed. In Japanese Unexamined Patent Application Publication No. 2004-282707, a plurality of IDT electrodes are provided on a piezoelectric substrate in order to form a longitudinally coupled resonator elastic wave filter. A three-dimensional wiring portion is provided at the side of the longitudinally coupled resonator elastic wave filter. The three-dimensional wiring portion includes a lower layer wiring line, an insulating layer provided on the lower layer wiring line, and an upper layer wiring line provided on the insulating layer.

In the elastic wave device, a cover member including an opening that opens downwardly may be provided on the piezoelectric substrate in order to seal the portion in which the IDT electrodes are provided. In such a case, the cover member is arranged so that a bottom opening edge portion of the cover member surrounds the portion at which the longitudinally coupled resonator elastic wave filter is disposed. However, in a case in which the cover member is provided so as to surround not only the longitudinally coupled resonator elastic wave filter but also the three-dimensional wiring portion, the dimensions of the elastic wave device become larger.

On the other hand, in a case in which the cover member is provided so as not to surround the three-dimensional wiring portion but so as to surround the longitudinally coupled resonator elastic wave filter, the opening edge of the cover member lies between the IDT electrodes and the three-dimensional wiring portion. Consequently, it is necessary to increase the space between the IDT electrodes that form the longitudinally coupled resonator elastic wave filter and the three-dimensional wiring portion. Therefore, there is a problem in that dimensions of the elastic wave device are increased.

Furthermore, in the case in which the cover member is provided so as to surround the three-dimensional wiring portion and in the case in which the cover member is provided so as not to surround the three-dimensional wiring portion but so as to surround the longitudinally coupled resonator elastic wave filter, the distance between the cover member and the IDT electrodes is reduced and, therefore, there is a risk of a top plate of the cover member caving in or collapsing toward the piezoelectric substrate and of the cover member and an IDT electrode coming into contact with each other due to the pressure of a sealing resin that covers the cover member, for example.

SUMMARY OF THE INVENTION

Preferred embodiments of the present invention provide elastic wave devices that each have a reduced size and in which contact is unlikely to occur between a cover member and an IDT electrode.

An elastic wave device according to a preferred embodiment of the present invention includes an element substrate that has piezoelectricity; an IDT electrode that is provided on the element substrate and that defines a longitudinally coupled resonator elastic wave filter; a three-dimensional wiring portion that is provided on the element substrate and is connected to the longitudinally coupled resonator elastic wave filter; and a cover member that surrounds the longitudinally coupled resonator elastic wave filter. The three-dimensional wiring portion includes a lower layer wiring line, an upper layer wiring line, and an insulating layer stacked between the lower layer wiring line and the upper layer wiring line. The cover member includes a portion that is positioned on the three-dimensional wiring portion.

In an elastic wave device according to a preferred embodiment of the present invention, the three-dimensional wiring portion is provided outside the longitudinally coupled resonator elastic wave filter in a direction perpendicular or substantially perpendicular to an elastic wave propagation direction of the longitudinally coupled resonator elastic wave filter, the cover member includes an opening edge that is positioned on the three-dimensional wiring portion, the insulating layer extends from the three-dimensional wiring portion to outside of the opening edge of the cover member in the elastic wave propagation direction, and the opening edge of the cover member is positioned on not only the three-dimensional wiring portion but also on the insulating layer. In this case, a level difference between an upper surface of the three-dimensional wiring portion and an upper surface of an extending portion is able to be made small. Therefore, cracks are unlikely to occur in the cover member.

In an elastic wave device according to a preferred embodiment of the present invention, the opening edge of the cover member includes first and second opening edge portions that extend in the elastic wave propagation direction, and the insulating layer is positioned below the first and second opening edge portions along entire or substantially entire lengths of the first and second opening edge portions. In this case, the level difference between the three-dimensional wiring portion and other portions is small along the entire or substantially the entire lengths of the first and second opening edge portions. Therefore, cracks are even less likely to occur in the cover member.

In an elastic wave device according to a preferred embodiment of the present invention, the opening edge of the cover member includes third and fourth opening edge portions that connect respective ends of the first and second opening edge portions to each other.

In an elastic wave device according to a preferred embodiment of the present invention, the insulating layer is positioned below the first and second opening edge portions and the third and fourth opening edge portions, and the insulating layer has a frame shape.

In an elastic wave device according to a preferred embodiment of the present invention, the upper layer wiring line is positioned below the first and second opening edge portions along the entire or substantially the entire lengths of the first and second opening edge portions of the cover member. In this case, cracks are even less likely to occur in the cover member.

In an elastic wave device according to a preferred embodiment of the present invention, the cover member and the insulating layer include the same or substantially the same insulating material as a main component. In this case, cracks are unlikely to occur in the cover member even when heat is generated when the cover member is formed and even when heat shock is applied during use.

The cover member and the insulating layer are preferably made of the same material.

In an elastic wave device according to a preferred embodiment of the present invention, the insulating layer extends onto the IDT electrode.

In an elastic wave device according to a preferred embodiment of the present invention, the element substrate is a piezoelectric substrate.

An elastic wave device manufacturing method according to a preferred embodiment of the present invention includes providing an IDT electrode to form a longitudinally coupled resonator elastic wave filter and a three-dimensional wiring portion that is connected to the longitudinally coupled resonator elastic wave filter on an element substrate that has piezoelectricity; and bonding a cover member that surrounds the longitudinally coupled resonator elastic wave filter to the element substrate. The three-dimensional wiring portion includes a lower layer wiring line, an upper layer wiring line, and an insulating layer stacked between the lower layer wiring line and the upper layer wiring line. The cover member is bonded to the upper layer wiring line of the three-dimensional wiring portion.

With the elastic wave devices and the manufacturing methods therefor according to preferred embodiments of the present invention, size reduction of an elastic wave device is able to be achieved and it is unlikely that contact will occur between a cover member and an IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

The preferred embodiments described in the present specification are illustrative examples and portions of the configurations illustrated in the different preferred embodiments may be substituted for one another or combined with one another.

Figure 1:
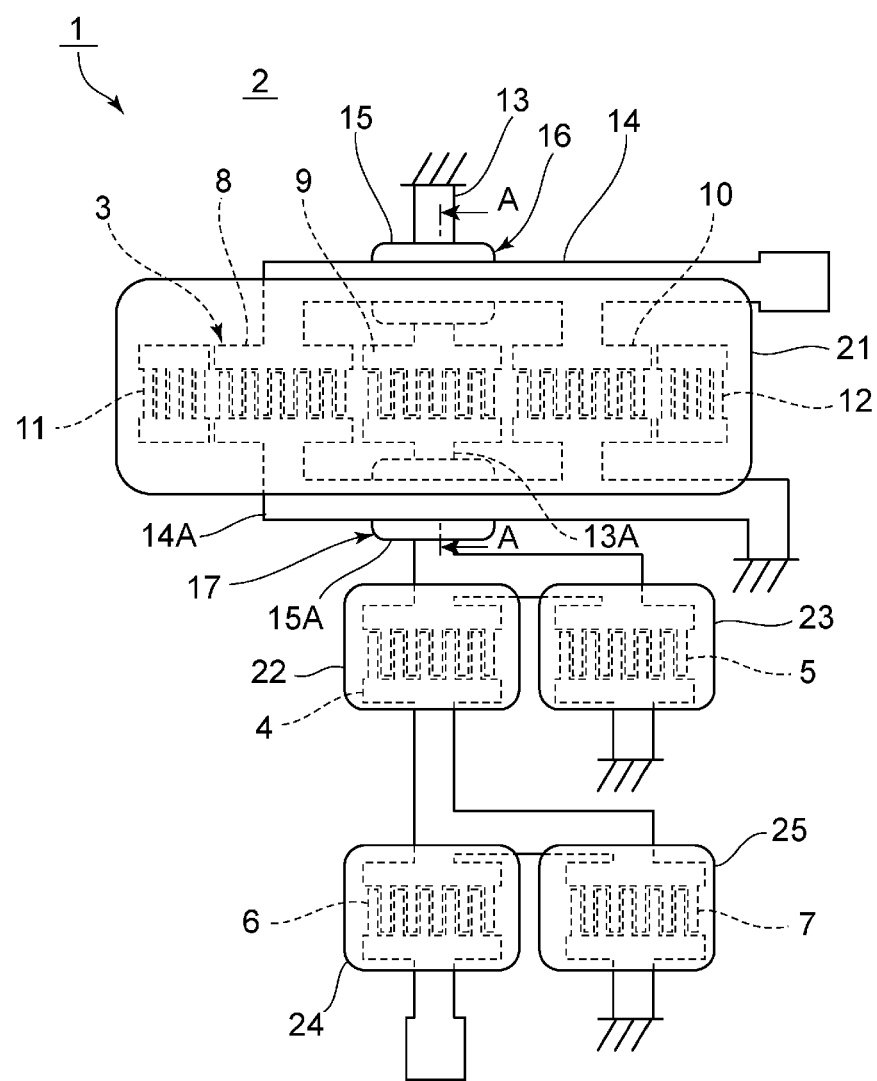
FIG. 1 is a schematic plan view of an elastic wave device according to a first preferred embodiment of the present invention.

FIG. 1 is a schematic plan view of an elastic wave device according to a first preferred embodiment of the present invention. An elastic wave device 1 includes a longitudinally coupled resonator elastic wave filter 3 and elastic wave resonators 4 to 7 on a piezoelectric substrate 2, which defines and functions as an element substrate. The longitudinally coupled resonator elastic wave filter 3 includes three IDT electrodes 8 to 10. A reflector 11 is provided on one side and a reflector 12 is provided on the other side of the region in which the IDT electrodes 8 to 10 are provided in an elastic wave propagation direction. One end of the IDT electrode 9 is electrically connected to a lower layer wiring line 13. In addition, the IDT electrodes 8 and 10 are connected to each other by an upper layer wiring line 14. The upper layer wiring line 14 is positioned on an insulating layer 15 in order to prevent short circuits between the upper layer wiring line 14 and the lower layer wiring line 13. As a result, a three-dimensional wiring portion 16 is defined by the lower layer wiring line 13, the insulating layer 15, and the upper layer wiring line 14. A three-dimensional wiring portion 17 is similarly provided on the other side of the IDT electrodes 8 to 10. A lower layer wiring line 13A, an insulating layer 15A, and an upper layer wiring line 14A are stacked on top of one another in the three-dimensional wiring portion 17. The three-dimensional wiring portions 16 and are disposed outside the longitudinally coupled resonator elastic wave filter 3 in a direction that is perpendicular or substantially perpendicular to the elastic wave propagation direction.

The insulating layers 15 and 15A are preferably made of a suitable insulating ceramic, such as $SiO_2$ or SiN, for example. The material of the insulating layers 15 and 15A is not restricted as long as the main component thereof is an insulating material.

On the other hand, the IDT electrodes 8 to 10, the reflectors 11 and 12, the lower layer wiring lines 13 and 13A, and the upper layer wiring lines 14 and 14A are preferably made of a suitable metal or alloy. In addition, a multilayer metal film in which a plurality of metal films are stacked may be used.

A cover member 21 is bonded to the top of the piezoelectric substrate 2 to seal the longitudinally coupled resonator elastic wave filter 3. In addition, cover members 22 to 25 are similarly bonded to the top of the piezoelectric substrate 2 to seal the elastic wave resonators 4 to 7.

Figure 2:
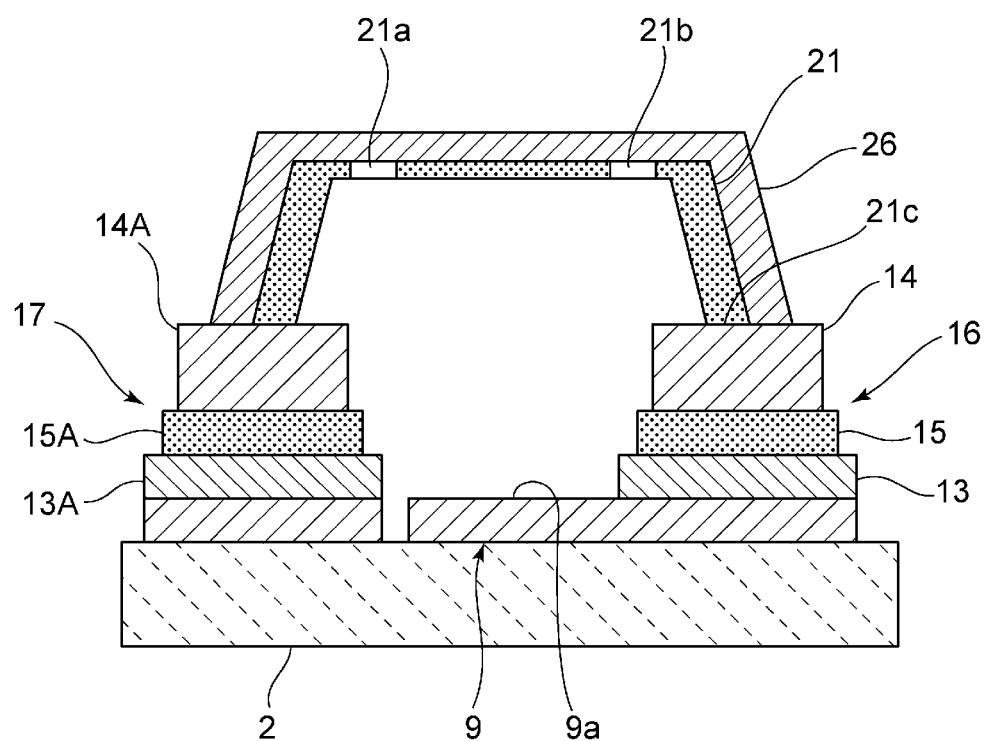
FIG. 2 is a sectional view taken along line A-A in FIG. 1.

FIG. 2 is a sectional view taken along line A-A in FIG. 1. The cover member 21 includes an opening edge of an opening that opens downward. A cross section of a portion in which electrode fingers 9a of the IDT electrode 9 are provided is illustrated. Although not illustrated in FIG. 1, a sealing layer 26 illustrated in FIG. 2 is provided so as to cover the cover member 21. The sealing layer 26 is preferably made of, for example, an insulating ceramic, such as $Al_2O_3$ or SiN, or a composite resin, such as polyimide or epoxy resin.

As illustrated in FIG. 2, etching holes 21a and 21b are provided in the cover member 21. The sealing layer 26 seals the etching holes 21a and 21b. The etching holes 21a and 21b are provided in order to remove a sacrificial layer provided inside the cover member 21 as will become clear from the later description of the manufacturing method.

As illustrated in FIG. 2, in the three-dimensional wiring portions 16 and 17, the insulating layers 15 and 15A are stacked between the lower layer wiring lines 13 and 13A and the upper layer wiring lines 14 and 14A. A bottom opening edge 21c of the cover member 21 is stacked on the upper layer wiring lines 14 and 14A. In other words, a portion of the bottom opening edge 21c of the cover member 21 is positioned above the three-dimensional wiring portions 16 and 17 and is bonded to the upper surfaces of the three-dimensional wiring portions 16 and 17. Therefore, the dimensions of the cover member 21 in the portion at which the longitudinally coupled resonator elastic wave filter 3 is provided is able to be made small. As described above, when the cover member surrounds a three-dimensional wiring portion, the dimension of the elastic wave device in a direction perpendicular or substantially perpendicular to the elastic wave propagation direction becomes large.

In addition, in the present preferred embodiment, a portion of the bottom opening edge 21c of the cover member 21 is positioned above the three-dimensional wiring portions 16 and 17 and is bonded to the upper surfaces of the three-dimensional wiring portions 16 and 17. Therefore, there is no need to increase the distance between the three-dimensional wiring portions 16 and 17 and the IDT electrode 9 in order to provide a portion of the bottom opening edge 21c of the cover member 21 between the three-dimensional wiring portions 16 and 17 and the IDT electrode 9. Therefore, the dimension of the cover member 21 in the direction perpendicular or substantially perpendicular to the elastic wave propagation direction is able to be effectively reduced and the elastic wave device 1 is able to be reduced in size. In addition, since the distance between the cover member 21 and the IDT electrode 9 is increased as a result of the cover member 21 being provided on the three-dimensional wiring portions 16 and 17, a situation in which the IDT electrode 9 and the cover member 21 come into contact with each other is able to be reduced or prevented even in the case in which the top plate of the cover member 21 caves in or collapses toward the piezoelectric substrate 2.

Referring to FIGS. 3A to 3C, FIGS. 4A to 4C, and FIG. 5, a method of manufacturing the portion of the elastic wave device 1 in which the longitudinally coupled resonator elastic wave filter 3 is provided will be described.

Figure 3A:
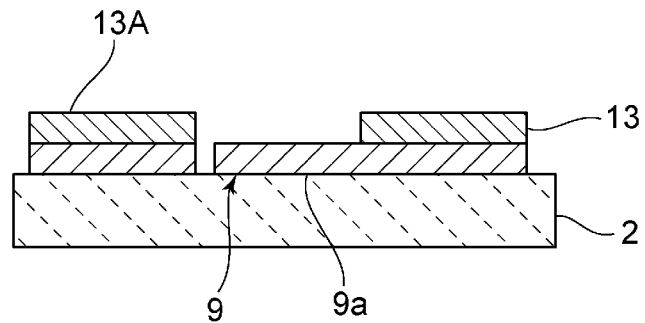
FIGS. 3A to 3C are front sectional views for describing a method of manufacturing the elastic wave device of the first preferred embodiment of the present invention.

As illustrated in FIG. 3A, the IDT electrode 9, which includes the electrode fingers 9a, and the lower layer wiring lines and 13A are formed on the piezoelectric substrate 2, which defines and functions as an element substrate. The method of forming the IDT electrode 9 and the lower layer wiring lines 13 and 13A is not particularly restricted, and, for example, a vapor deposition lift off method may be used.

Figure 3B:
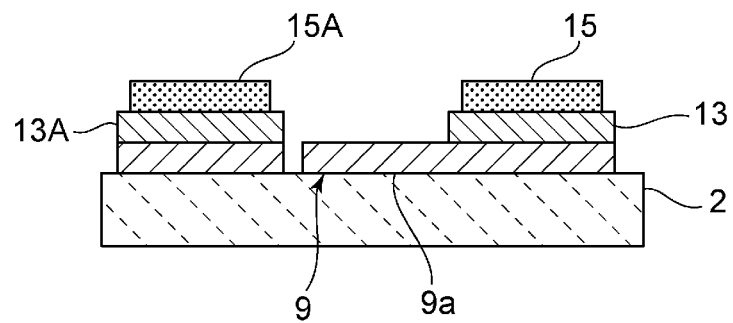

Next, the insulating layers 15 and 15A are formed on the lower layer wiring lines 13 and 13A, as illustrated in FIG. 3B. These insulating layers may be formed by performing sputtering, for example.

Figure 3C:
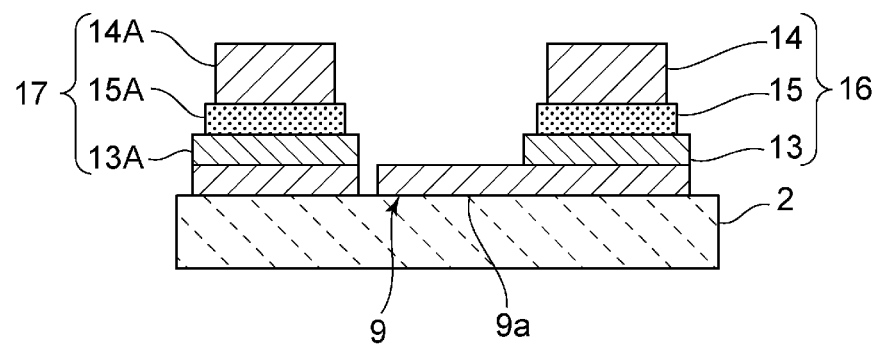

Next, as illustrated in FIG. 3C, the upper layer wiring lines 14 and 14A are formed on the insulating layers 15 and 15A. The upper layer wiring lines 14 and 14A may also be formed using a vapor deposition lift off method, for example.

Figure 4A:
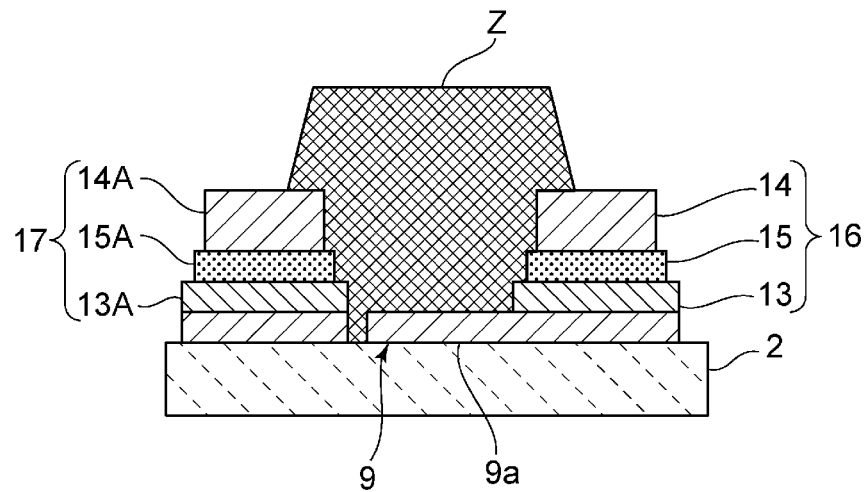
FIGS. 4A to 4C are front sectional views for describing a method of manufacturing the elastic wave device of the first preferred embodiment of the present invention.

Next, as illustrated in FIG. 4A, a sacrificial layer Z is provided so as to cover the IDT electrode 9. The sacrificial layer Z is provided so as to extend onto a portion of the three-dimensional wiring portion 16 and a portion of the three-dimensional wiring portion 17. Furthermore, the sacrificial layer Z is provided so as to have a shape that fills the inside of the cover member 21 described above. A suitable material that is able to be eluted using an organic solvent or an acidic mixed solution may be used as the material of the sacrificial layer Z. For example, polyimide or epoxy resin may be suitably used.

Figure 4B:
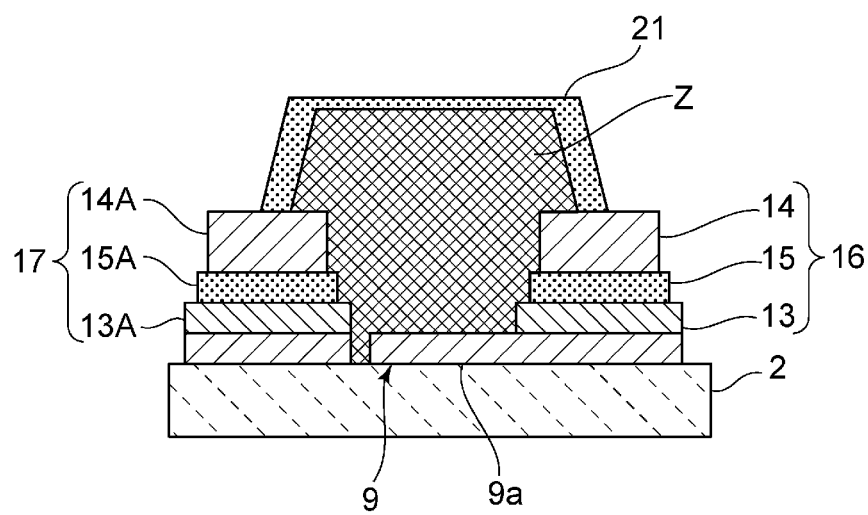

As illustrated in FIG. 4B, the cover member 21 is formed by applying an insulating material onto the sacrificial layer Z. The material of the cover member 21 is not particularly restricted as long as the material is an insulating material, and, for example, $SiO_2$, SiN, or other suitable material may preferably be used. In addition, the method of forming the cover member 21 is also not particularly restricted, and, for example, CVD, sputtering, or other suitable method may be suitably used.

Figure 4C:
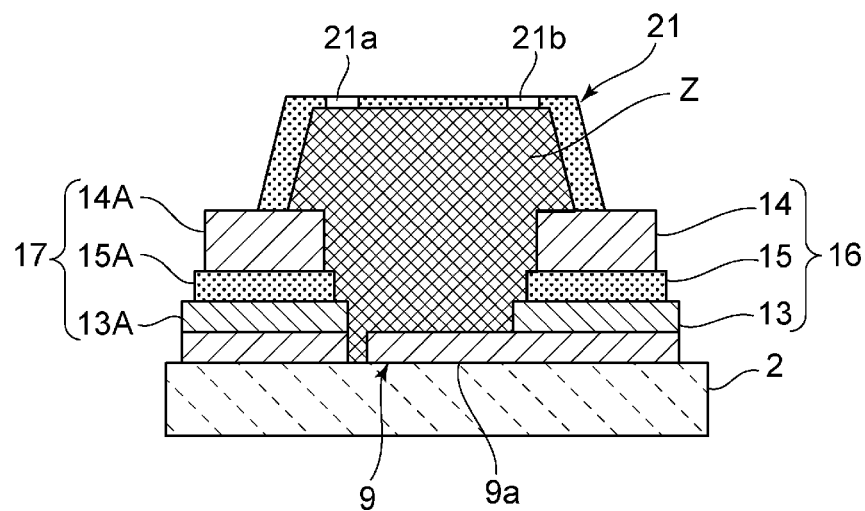

Next, as illustrated in FIG. 4C, the etching holes 21a and 21b are provided in the top plate of the cover member 21 using an etching method, such as dry etching, for example.

Figure 5:
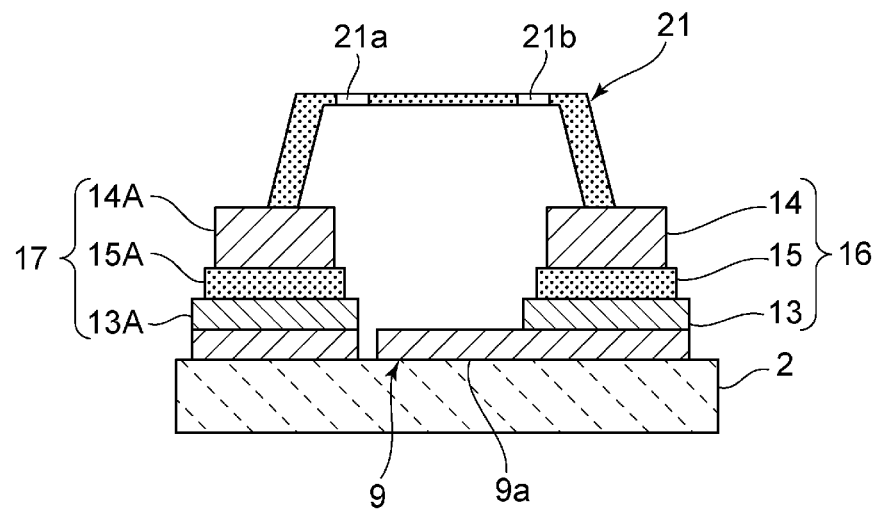
FIG. 5 is a front sectional view for describing a manufacturing step for the elastic wave device according to the first preferred embodiment of the present invention.

After that, the sacrificial layer Z inside the cover member 21 is removed by utilizing the etching holes 21a and 21b and using a liquid that elutes the sacrificial layer Z. As a result, as illustrated in FIG. 5, a structure is obtained in which the inside of the cover member 21 is a hollow space. Finally, the sealing layer 26 is provided so as to cover the outer surface of the cover member 21. Thus, the elastic wave device 1 is obtained.

In addition, it is preferable that the insulating layers 15 and 15A be made of the same insulating material as the cover member 21. In this case, the number of types of materials that are used is reduced. Furthermore, since the difference between the thermal expansion coefficients is small, cracks are even less likely to occur in the cover member 21 in the manufacturing process and when a thermal shock occurs during actual use.

Figure 6:
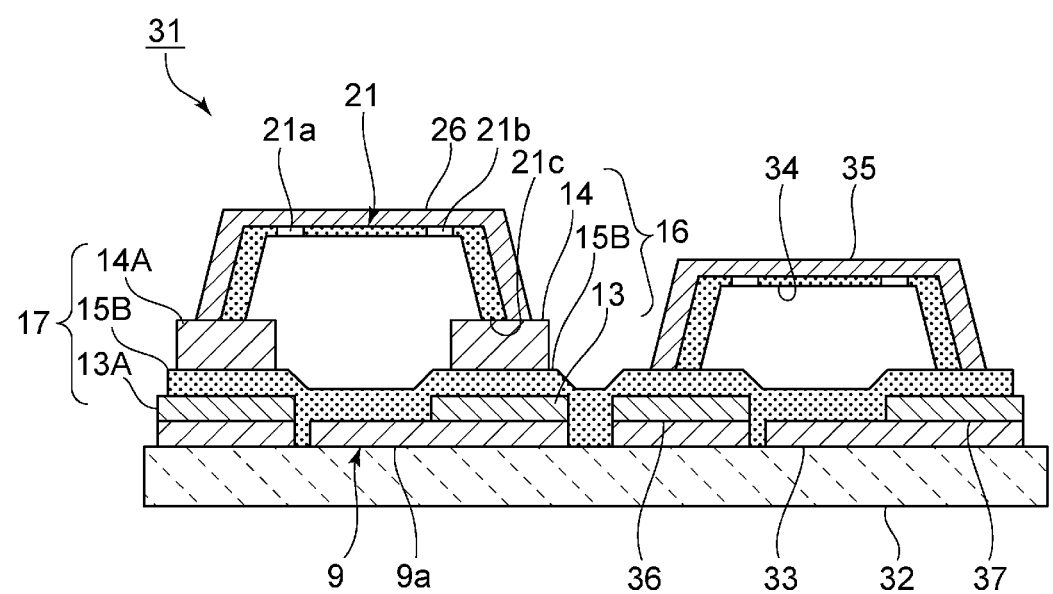
FIG. 6 is a front sectional view of an elastic wave device according to a second preferred embodiment of the present invention.

FIG. 6 is a front sectional view of an elastic wave device according to a second preferred embodiment of the present invention. In an elastic wave device 31 of the second preferred embodiment, on a piezoelectric substrate 32 defining and functioning as an element substrate, a structure is provided in which a longitudinally coupled resonator elastic wave filter configured in the same or substantially the same manner as in the above-described preferred embodiment is sealed by the cover member 21 and the sealing layer 26. However, an insulating layer 15B is provided not only in the three-dimensional wiring portions but also to cover the portion at which the IDT electrode 9 is provided. Thus, the insulating layer 15B may also cover the IDT electrode 9 of the longitudinally coupled resonator elastic wave filter.

Furthermore, in the elastic wave device 31, an IDT electrode 33 of an elastic wave resonator is provided at the side of the region in which the IDT electrode 9 of the longitudinally coupled resonator elastic wave filter is provided. The above-described insulating layer 15B also covers the IDT electrode 33 in the portion at which this elastic wave resonator is provided. A cover member 34 is provided such that an opening edge of the cover member 34 is positioned on the insulating layer 15B in a portion at which the elastic wave resonator is provided. A sealing layer 35 covers the cover member 34. In FIG. 6, the opening edge of the cover member 34 is bonded to the top of the insulating layer 15B stacked on wiring lines 36 and 37. A portion of the bottom opening edge 21c of the cover member 21 is positioned above the three-dimensional wiring portions 16 and 17 and is bonded to the upper surfaces of the three-dimensional wiring portions 16 and 17. Therefore, compared to a comparative example of a portion of the bottom opening edge 21c of the cover member 21 between the three-dimensional wiring portions 16 and 17 and the IDT electrode 9, the dimension of the present preferred embodiment in a direction that is perpendicular or substantially perpendicular to the elastic wave propagation direction is able to be made smaller even in a portion at which an elastic wave resonator is provided. In the elastic wave device 31 as well, as described above, the opening edge of the cover member 21 is positioned on the three-dimensional wiring portions, and therefore, the elastic wave device 31 is able to be reduced in size. In addition, cracks are unlikely to occur in the cover members 21 and 34.

Figure 7:
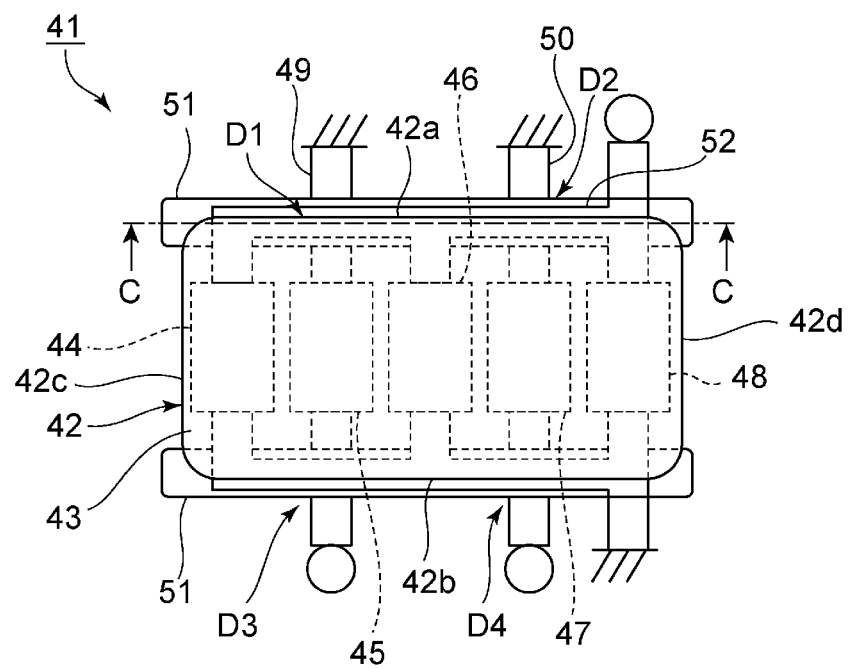
FIG. 7 is a schematic plan view of an elastic wave device according to a third preferred embodiment of the present invention.

FIG. 7 is a schematic plan view of an elastic wave device according to a third preferred embodiment of the present invention. In an elastic wave device 41, a cover member 42 surrounds a five-IDT longitudinally coupled resonator elastic wave filter. A sealing layer 43 is provided on a top plate of the cover member 42. As illustrated by the broken lines in FIG. 7, five IDT electrodes 44 to 48 are provided in the elastic wave device 41. Although not illustrated in FIG. 7, in reality, reflectors are provided at both sides of the region in which the IDT electrodes 44 to 48 are provided in the elastic wave propagation direction.

In the longitudinally coupled resonator elastic wave filter, the end portions of adjacent IDT electrodes on the same side are connected to different electrical potentials. Therefore, in the elastic wave device 41, three-dimensional wiring portions are provided in portions indicated by arrows D1 to D4. In the elastic wave device 41, an insulating layer of the three-dimensional wiring portions extends in the elastic wave propagation direction not only in the three-dimensional wiring portions. This will be described below in more detail.

An opening edge of the cover member 42 preferably has a rectangular or substantially rectangular shape, and includes first and second opening edge portions 42a and 42b that extend in the elastic wave propagation direction, and third and fourth opening edge portions 42c and 42d that connect the first and second opening edge portions 42a and 42b to each other and extend in a direction perpendicular or substantially perpendicular to the elastic wave propagation direction. In the elastic wave device 41, the insulating layer extends not only in the portions at which the three-dimensional wiring portions indicated by the arrows D1 and D2 are provided but also along the entire or substantially the entire length of the first opening edge portion 42a.

Figure 8:
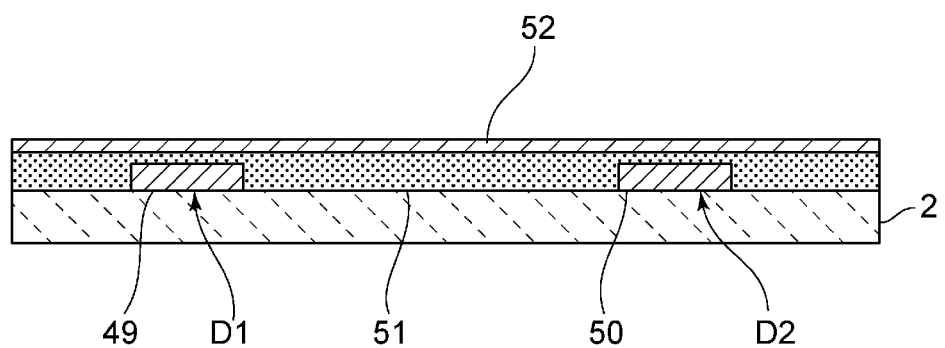
FIG. 8 is a sectional view taken along line C-C in FIG. 7 in which a cover member and a sealing layer have been removed.

FIG. 8 is a sectional view taken along line C-C in FIG. 7 in which the cover member 42 and the sealing layer 43 have been removed.

As illustrated in FIG. 8, lower layer wiring lines 49 and 50 are provided on the piezoelectric substrate 2 defining and functioning as an element substrate. As illustrated in FIG. 7, the lower layer wiring lines 49 and 50 are connected to first ends of the IDT electrodes 45 and 47. An insulating layer 51 covers the lower layer wiring lines 49 and 50. An upper layer wiring line 52 electrically connects first ends of the IDT electrodes 44, 46, and 48 to each other. Therefore, the insulating layer 51 is stacked between the lower layer wiring line 49 and the upper layer wiring line 52 or between the lower layer wiring line 50 and the upper layer wiring line 52 in the three-dimensional wiring portions indicated by the arrows D1 and D2.

As illustrated in FIG. 7, the first opening edge portion 42a of the cover member 42 is positioned above the portion at which the upper layer wiring line 52 is provided. In other words, the insulating layer 51 is positioned below the first opening edge portion 42a along the entire or substantially the entire length of the first opening edge portion 42a in the elastic wave propagation direction. Therefore, in the insulating layer 51, the level difference between the upper surfaces of the portions corresponding to the three-dimensional wiring portions indicated by D1 and D2 and the upper surface of the insulating layer 51 that extends to the region outside the first opening edge portion 42a is very small. Thus, the cover member 42 is firmly bonded. Therefore, since the level difference is small, cracks are unlikely to occur in the cover member 42 even when heat is applied. Similarly, the insulating layer 51 is also positioned below the second opening edge portion 42b along the entire or substantially the entire length of the second opening edge portion 42b. Therefore, in the insulating layer 51, the level difference between the upper surfaces of the portions corresponding to the three-dimensional wiring portions indicated by D3 and D4 and the upper surface of the insulating layer 51 that extends to the region outside the second opening edge portion 42b is very small.

A method of manufacturing the elastic wave device 41 will be described while referring to FIGS. 9A to 9C, 10A and 10B, and 11A to 11C.

Figure 9A:
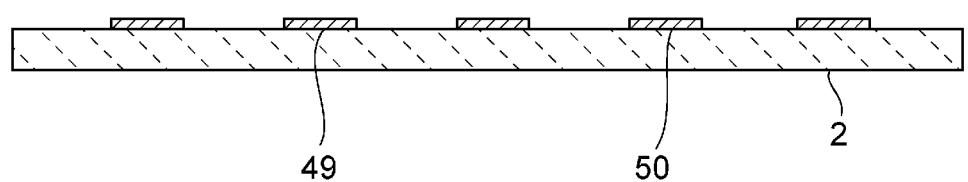
FIGS. 9A to 9C are front sectional views for describing a method of manufacturing the elastic wave device of the third preferred embodiment of the present invention.
Figure 9B:
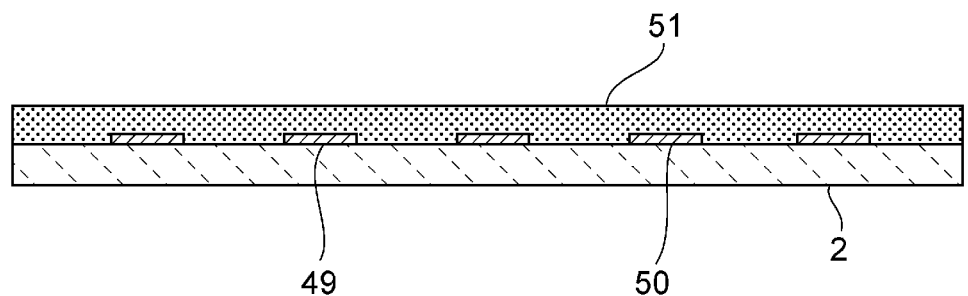
Figure 9C:
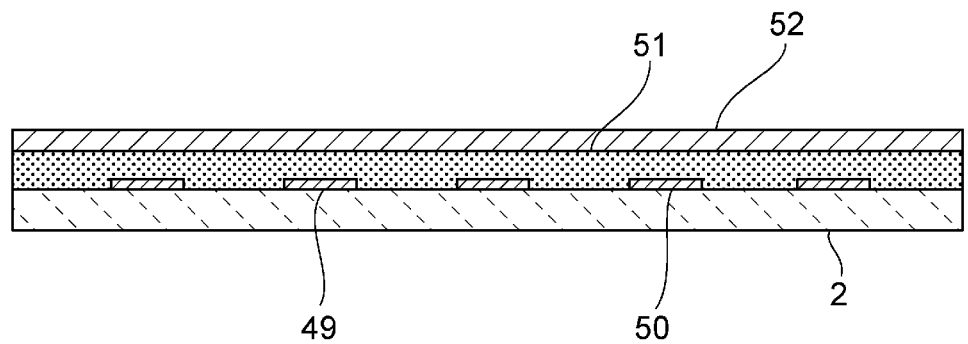

As illustrated in FIG. 9A, a plurality of lower layer wiring lines including the lower layer wiring lines 49 and 50 are formed on the piezoelectric substrate 2 defining and functioning as an element substrate by a vapor deposition lift off method or other suitable method, for example. As illustrated in FIG. 9B, the insulating layer 51 is formed by CVD, sputtering, or other suitable method, for example. In FIG. 9B, the upper surface of the insulating layer 51 is shown as being flat, but in reality, the upper surface will protrude upward slightly in the portions at which the lower layer wiring lines 49 and 50 are provided. Next, as illustrated in FIG. 9C, the upper layer wiring line 52 is formed on the insulating layer 51. A vapor deposition lift off method or other suitable method may also be used as appropriate to form the upper layer wiring line 52, and the method is not particularly restricted.

Figure 10A:
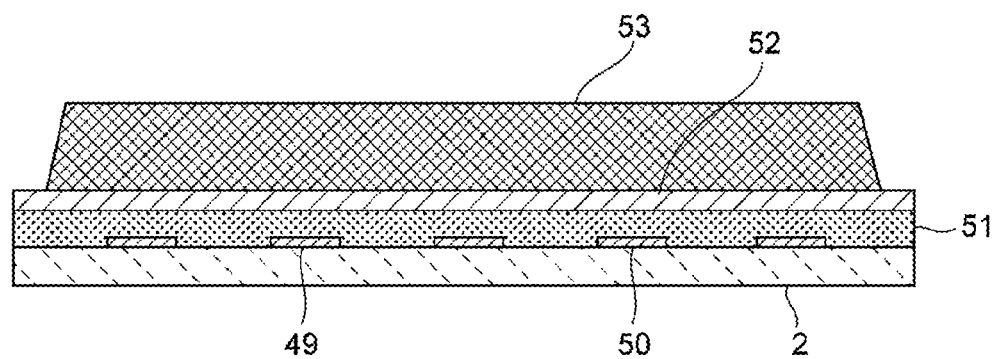
FIGS. 10A and 10B are front sectional views for describing a method of manufacturing the elastic wave device of the third preferred embodiment of the present invention.
Figure 10B:
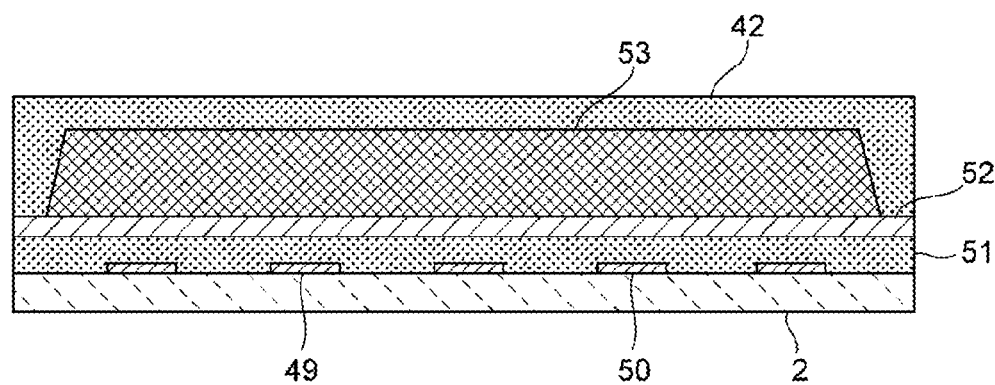

After that, as illustrated in FIG. 10A, a sacrificial layer 53 is provided. The sacrificial layer 53 may be formed of the same material as the sacrificial layer Z described above. As illustrated in FIG. 10B, the cover member 42 is provided on the sacrificial layer 53. The cover member 42 may be formed using CVD, sputtering, or other suitable method.

Figure 11A:
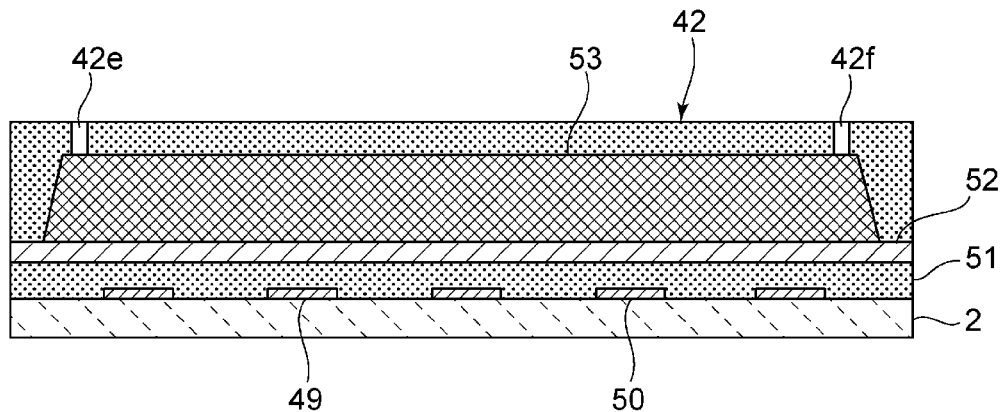
FIGS. 11A to 11C are front sectional views for describing a method of manufacturing the elastic wave device of the third preferred embodiment of the present invention.
Figure 11B:
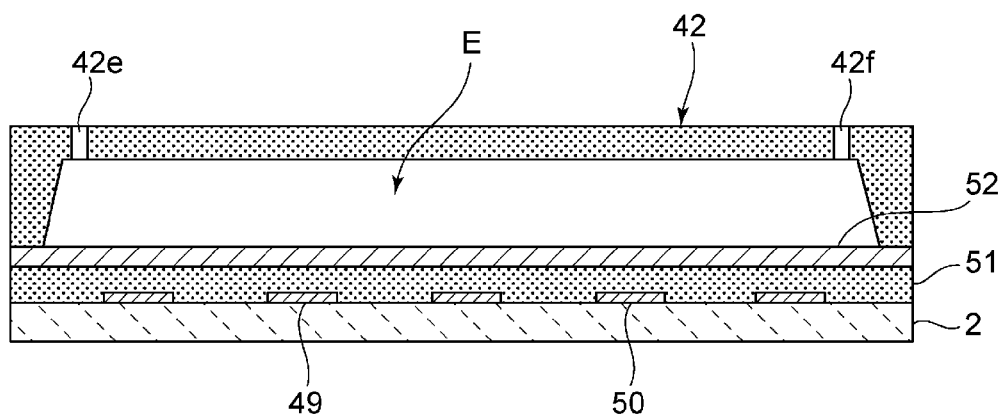

Next, as illustrated in FIG. 11A, etching holes 42e and 42f are provided in the cover member 42. The etching holes 42e and 42f may be formed using dry etching or other suitable method, for example. Next, as illustrated in FIG. 11B, the sacrificial layer 53 is removed by utilizing the etching holes 42e and 42f and using an etchant, for example. As a result, a hollow space E is formed.

Figure 11C:
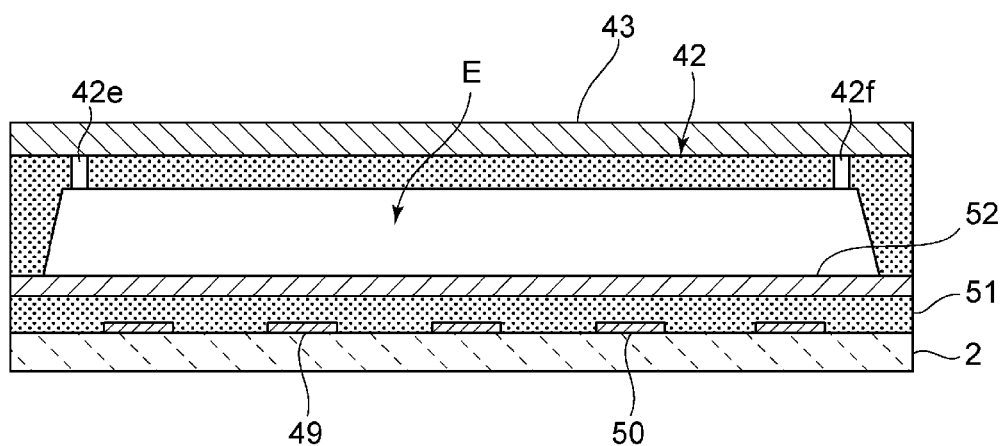

Next, as illustrated in FIG. 11C, the sealing layer 43 is provided on the top plate of the cover member 42 so as to seal the etching holes 42e and 42f. Thus, the elastic wave device 41 is obtained.

When manufacturing the elastic wave device 41, since the level difference at the opening edge of the cover member 42 is small, cracks are unlikely to occur in the cover member 42 even when heat is applied when forming the sealing layer 43 or when forming the sealing resin.

Figure 12:
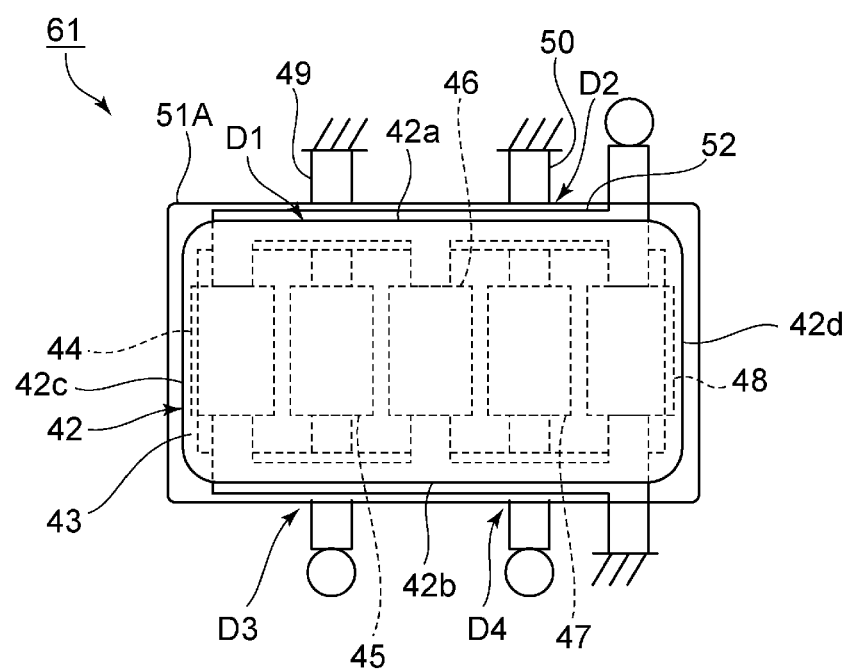
FIG. 12 is a schematic plan view of an elastic wave device according to a fourth preferred embodiment of the present invention.

FIG. 12 is a schematic plan view of an elastic wave device according to a fourth preferred embodiment of the present invention. An elastic wave device 61 includes a frame-shaped insulating layer 51A. The insulating layer 51A is positioned below the first and second opening edge portions 42a and 42b and below the third and fourth opening edge portions 42c and 42d of the cover member 42. In other respects, the elastic wave device 61 is the same or substantially the same as the elastic wave device 41. Therefore, identical portions are denoted by identical reference symbols and description thereof is omitted.

As in the case of the insulating layer 51A, the insulating layer 51A may be positioned below the entire or substantially the entire opening edge of the cover member 42. In this case, since the insulating layer 51A is also positioned below the third and fourth opening edge portions 42c and 42d, the bonding strength of the cover member 42 is more effectively increased.

In the above-described preferred embodiments, the element substrate is preferably a piezoelectric substrate. However, preferred embodiments of in the present invention, an element substrate having piezoelectricity may be a substrate obtained by stacking a piezoelectric thin film on a support substrate or on an acoustic multilayer film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    an element substrate that has piezoelectricity;
    an IDT electrode provided on the element substrate and defining a longitudinally coupled resonator elastic wave filter;
    a first three-dimensional wiring portion and a second three-dimensional wiring portion provided on the element substrate and connected to the longitudinally coupled resonator elastic wave filter; and
    a first cover that covers the longitudinally coupled resonator elastic wave filter, and includes a recessed shape that opens toward the longitudinally coupled resonator elastic wave filter, and a first opening edge portion defined by one edge portion of the recessed shape and a second opening edge portion defined by another edge portion of the recessed shape; wherein
    the longitudinally coupled resonator elastic wave filter is disposed between the first three-dimensional wiring portion and the second three-dimensional wiring portion in a direction perpendicular or substantially perpendicular to an elastic wave propagation direction of the longitudinally coupled resonator elastic wave filter;
    the first opening edge portion of the first cover is positioned on the first three-dimensional wiring portion; and
    the second opening edge portion of the first cover is positioned on the second three-dimensional wiring portion.

2. The elastic wave device according to claim 1, wherein the first three-dimensional wiring portion includes a first lower layer wiring line, a first upper layer wiring line, and a first insulating layer between the lower layer wiring line and the upper layer wiring line;
    the second three-dimensional wiring portion includes a second lower layer wiring line, a second upper layer wiring line, and a second insulating layer between the lower layer wiring line and the upper layer wiring line;
    the first opening edge portion of the first cover is positioned on the first upper layer wiring line; and
    the second opening edge portion of the first cover is positioned on the second upper layer wiring line.

3. The elastic wave device according to claim 2, wherein the first cover, the first insulating layer, and the second insulating layer include a same or substantially a same material as a main component thereof.

4. The elastic wave device according to claim 2, wherein the first insulating layer and the second insulating layer are defined by a single insulating layer; and
    the single insulating layer covers the first lower layer wiring line, the second lower layer wiring line, and the IDT electrode.

5. The elastic wave device according to claim 4, further comprising:
    an elastic wave resonator that includes a further IDT electrode provided on the element substrate;
    a third three-dimensional wiring portion and a fourth three-dimensional wiring portion provided on the element substrate; and
    a second cover that covers the further IDT electrode, and includes a recessed shape that opens toward the further IDT electrode, and a third opening edge portion defined by one edge portion of the recessed shape and a fourth opening edge portion defined by another edge portion of the recessed shape; wherein
    the third opening edge portion of the second cover is positioned on the single insulating layer; and
    the fourth opening edge portion of the second cover is positioned on the single insulating layer.

6. The elastic wave device according to claim 4, wherein the single insulating layer is positioned below the first opening edge portion and the second opening edge portion along entire or substantially entire lengths of the first opening edge portion and the second opening edge portion.

7. The elastic wave device according to claim 6, wherein the opening edge of the first cover includes a fifth opening edge portion and a sixth opening edge portion that connect respective ends of the first opening edge portion and the second opening edge portion to each other.

8. The elastic wave device according to claim 6, wherein the single insulating layer has a frame shape.

9. The elastic wave device according to claim 6, wherein the first upper layer wiring line or the second upper layer wiring line is positioned below the first opening edge portion and the second opening edge portion along entire or substantially entire lengths of the first opening edge portion and the second opening edge portion of the first cover.

10. The elastic wave device according to claim 2, wherein the first and second insulating layers are made of $SiO_2$ or SiN.

11. The elastic wave device according to claim 1, wherein the element substrate is a piezoelectric substrate.

12. The elastic wave device according to claim 1, wherein the longitudinally coupled resonator elastic wave filter includes three IDT electrodes; and
    reflectors are provided on opposite sides of a region in which the three IDT electrodes are provided in the elastic wave propagation direction.

13. The elastic wave device according to claim 1, further comprising a sealing layer covering the first cover.

14. The elastic wave device according to claim 13, wherein the sealing layer is made of $Al_2O_3$, SiN, polyimide, or epoxy resin.

15. The elastic wave device according to claim 13, wherein
- the first cover includes etching holes provided therein; and
- the sealing layer seals the etching holes.

16. The elastic wave device according to claim 1, wherein
- the longitudinally coupled resonator elastic wave filter includes five IDT electrodes; and
- the first cover surrounds the five IDT electrodes.

17. The elastic wave device according to claim 1, wherein
- the first three-dimensional wiring portion includes a first lower layer wiring line and a first upper layer wiring line;
- the second three-dimensional wiring portion includes a second lower layer wiring line and a second upper layer wiring line;
- a portion of each the first lower layer wiring line and the first upper layer wiring line is exposed from the first opening edge portion of the first cover in a plan view; and
- a portion of each the first lower layer wiring line and the first upper layer wiring line is exposed from the second opening edge portion of the first cover in the plan view.

\* \* \* \* \*